(12) United States Patent
Kim et al.

(10) Patent No.: US 10,965,291 B2
(45) Date of Patent: Mar. 30, 2021

(54) DELAY LOCKED LOOP

(71) Applicants: SK hynix Inc., Icheon (KR); Korea University Research and Business Foundation, Seoul (KR)

(72) Inventors: Chul Woo Kim, Seoul (KR); Hyun Su Park, Seoul (KR)

(73) Assignees: SK hynix Inc., Icheon (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/836,723

(22) Filed: Mar. 31, 2020

(65) Prior Publication Data

US 2021/0006253 A1 Jan. 7, 2021

(30) Foreign Application Priority Data

Jul. 4, 2019 (KR) .................. 10-2019-0080691

(51) Int. Cl.
*H03L 7/06* (2006.01)
*H03L 7/081* (2006.01)
*H03L 7/085* (2006.01)

(52) U.S. Cl.
CPC ............ *H03L 7/0814* (2013.01); *H03L 7/085* (2013.01); *H03L 7/0818* (2013.01)

(58) Field of Classification Search
CPC ...... H03L 7/0814; H03L 7/0818; H03L 7/085
USPC ........................................... 327/158
See application file for complete search history.

(56) References Cited

U.S. PATENT DOCUMENTS

| 5,945,862 | A  | * | 8/1999  | Donnelly | ............ | H03K 5/1565 327/241 |
| 6,326,826 | B1 | * | 12/2001 | Lee      | ............. | H03L 7/0812 327/161 |
| 7,009,434 | B2 | * | 3/2006  | Lee      | ............. | H03L 7/0818 327/158 |
| 7,733,138 | B2 | * | 6/2010  | Uehara   | ............. | H03L 7/0891 327/149 |
| 2007/0222492 | A1 | * | 9/2007  | Cafaro   | ............. | H03H 11/265 327/261 |
| 2008/0111720 | A1 | * | 5/2008  | Huang    | ............. | G04F 10/005 341/53 |
| 2018/0198439 | A1 | * | 7/2018  | Hsu      | ............. | H03K 5/131 |

FOREIGN PATENT DOCUMENTS

KR 100411551 B1 12/2003
KR 100884589 B1 2/2009

* cited by examiner

*Primary Examiner* — Ryan Jager

(57) ABSTRACT

A delay locked loop includes a main delay circuit including a plurality of unit delay lines that generate a plurality of internal clocks by delaying an input clock, delay amounts of the plurality of unit delay lines being adjusted in response to code signals; a sub-delay circuit including a plurality of sub-delay lines that generate a plurality of phase clocks by respectively delaying the input clock and the plurality of internal clocks; a phase detector configured to compare phases of the plurality of phase clocks and provide a phase detection signal according to a result of the comparison; and a digital circuit configured to update the code signals corresponding to the plurality of unit delay lines one by one at a time when the phase detection signal is provided to the digital circuit.

17 Claims, 4 Drawing Sheets

DELAY LOCKED LOOP

CROSS-REFERENCE TO RELATED APPLICATION

This application claims priority under 35 U.S.C. § 119 to Korean Patent Application No. 10-2019-0080691 filed on Jul. 4, 2019, which is incorporated herein by reference in its entirety.

BACKGROUND

1. Field

Exemplary embodiments relate to a semiconductor device, and more particularly, to a delay locked loop capable of operating a semiconductor device at a high speed and improving the performance of the semiconductor device.

2. Discussion of the Related Art

A semiconductor device may use a delay locked loop to compensate for time delays caused by internal circuits when an external clock is used internally.

The delay locked loop performs a locking operation by generating a plurality of clocks having different phases by delaying an input clock, comparing a phase of the input clock and a phase of a feedback clock, and adjusting a delay value according to a result of the comparison.

However, the delay locked loop according to the related art has the following drawbacks.

First, the delay locked loop has a minimum delay. The minimum delay may limit an operating frequency of the semiconductor device. For example, the delay locked loop that generates four phase clocks needs to have an minimum delay so that a phase difference between two of the four phase clocks due to the minimum delay corresponds to 90°.

However, when the phase difference between the phase clocks due to the minimum delay is larger than 90°, the delay locked loop has a problem of not aligning the phases of the four phase clocks within one cycle of the input clock.

This problem may limit the entire operating frequency of the semiconductor device that operates at a high speed.

Next, there is a drawback in time resolution. The drawback in the time resolution may degrade the performance of the semiconductor device. For example, in the delay locked loop that generates the four phase clocks, each of four unit delay lines is subjected to substantially the same change in delay code during phase alignment.

Therefore, in the delay locked loop including the four unit delay lines, when the time resolution of a unit delay line is $T_{RES}$, the total time resolution of the four unit delay lines increases to $4*T_{RES}$.

The time resolution increased in this way may cause bang-bang clock jitter and the output of phase clocks may be further affected by PVT variations, so that the performance of the semiconductor device may be degraded.

SUMMARY

Various embodiments are directed to a delay locked loop capable of operating a semiconductor device at a high speed and improving the performance of the semiconductor device by solving a time resolution issue.

In an embodiment, there is provided a delay locked loop including: a main delay circuit including a plurality of unit delay lines that generate a plurality of internal clocks by delaying an input clock, delay amounts of the plurality of unit delay lines being adjusted in response to code signals; a sub-delay circuit including a plurality of sub-delay lines that generate a plurality of phase clocks by respectively delaying the input clock and the plurality of internal clocks; a phase detector configured to compare phases of the plurality of phase clocks and provide a phase detection signal according to a result of the comparison; and a digital circuit configured to update the code signals corresponding to the plurality of unit delay lines one by one at a time when the phase detection signal is provided to the digital circuit.

In an embodiment, there is provided a delay locked loop including: a main delay circuit including first to fourth unit delay lines that generate first to fourth internal clocks by delaying an input clock, delay amounts of the first to fourth unit delay lines being adjusted one by one in response to first to fourth code signals; a sub-delay circuit configured to generate first to fourth phase clocks by respectively delaying the input clock and the first to third internal clocks with first to fourth delay values; a phase detector configured to compare phases of the first and fourth phase clocks and provide a phase detection signal according to a result of the comparison; and a digital circuit configured to update the first to fourth code signals one by one at a time when the phase detection signal is provided to the digital circuit.

In an embodiment, there is provided a method of generating phase clocks of a delay locked loop, the method comprising: generating, using a plurality of unit delay lines, a plurality of internal clocks by delaying an input clock; generating, using a plurality of sub-delay lines, a plurality of phase clocks by respectively delaying the input clock and the plurality of internal clocks, two phase clocks, which are sequentially generated among the plurality of phase clocks, having a phase difference corresponding to a desired minimum delay value; comparing phases of the plurality of phase clocks to thereby provide a phase detection signal according to a result of the comparison; and updating code signals corresponding to the plurality of unit delay lines one by one at a time when the phase detection signal is provided, an updated code signal being used to adjust a delay amount of a corresponding one of the plurality of unit delay lines.

According to the embodiments, in a delay locked loop, since unit delay lines have a code change one by one at a time, the total time resolution can be maintained at a level of the time resolution of a unit delay line.

Furthermore, the delay locked loop can improve the quality of multi-phase clocks by solving the problem of the time resolution, thereby improving the performance of a semiconductor device and operating the semiconductor device at a high speed.

DETAILED DESCRIPTION

Figure 1:
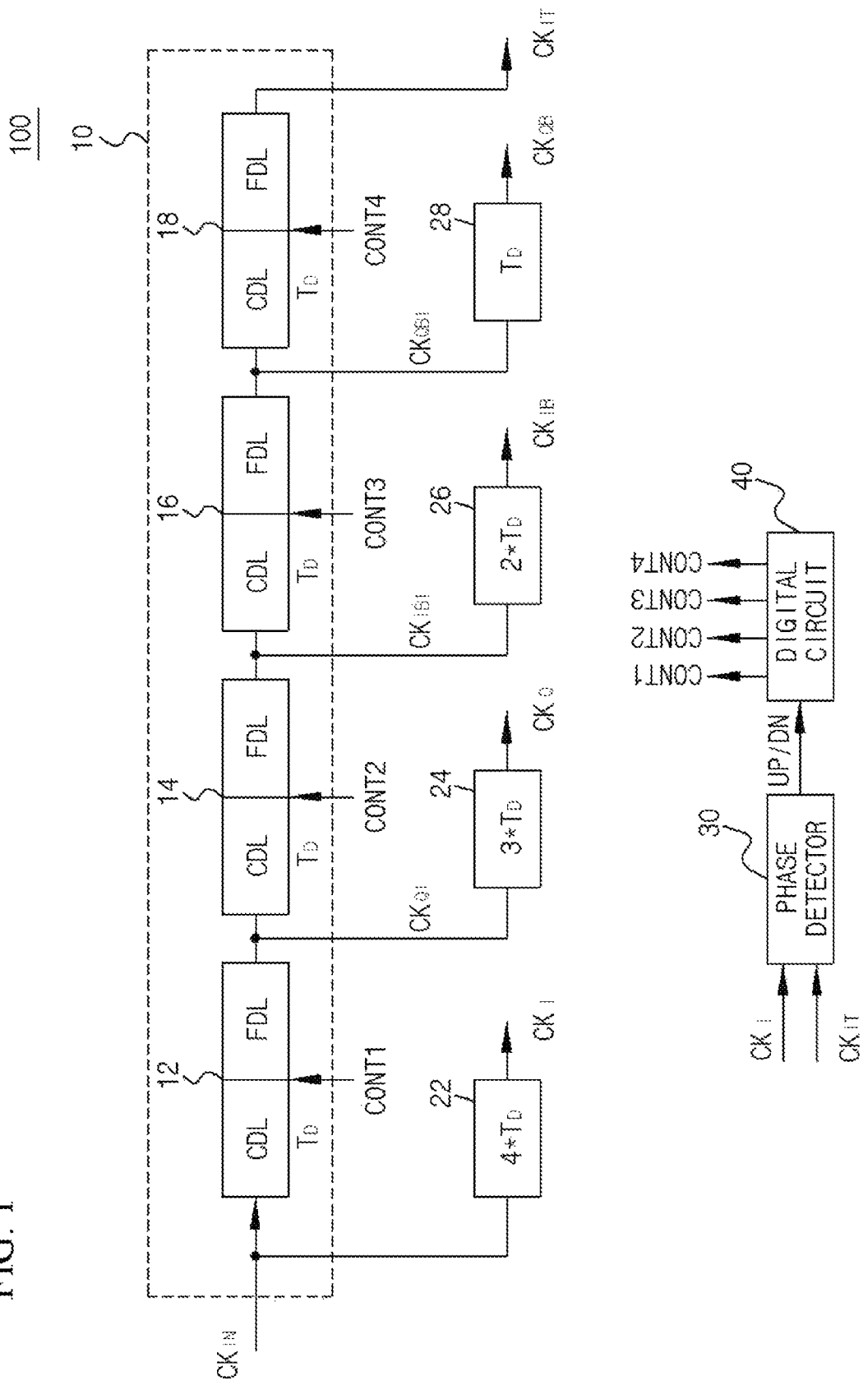
FIG. 1 illustrates a delay locked loop in accordance with an embodiment.

Various embodiments will be described below in more detail with reference to the accompanying drawings such that the present invention can be easily embodied by those skilled in the art to which the present invention pertains. Throughout the disclosure, like reference numerals refer to like parts throughout the various figures and embodiments of the present invention.

Moreover, detailed descriptions related to well-known functions or configurations will be ruled out in order not to unnecessarily obscure subject matters of the present invention.

The terms such as 'first' and 'second' may be used to describe various components, but the components are not limited by the terms, and the terms are used only to distinguish one component from another component.

The embodiments of the present disclosure provide a delay locked loop capable of improving the performance of a semiconductor device and operating the semiconductor device at a high speed by adjusting a minimum delay and a time resolution.

Although the embodiments exemplify that the delay locked loop generates four phase clocks, this is merely exemplary, and various modifications and other equivalent embodiments are possible therefrom.

FIG. 1 illustrates a delay locked loop 100 in accordance with an embodiment.

Referring to FIG. 1, the delay locked loop 100 includes a main delay circuit 10, a sub-delay circuit, a phase detector 30, and a digital circuit 40. The main delay circuit 10 includes first to fourth delay lines 12, 14, 16, and 18 that are serially connected to one another. The sub-delay circuit is connected to the main delay circuit 10, and includes first to fourth sub-delay lines 22, 24, 26, and 28.

The main delay circuit 10 receives an input clock $CK_{IN}$, and generates first to fourth internal clocks $CK_{Q1}$, $CK_{IB1}$, $CK_{QB1}$, and $CK_{IT}$ by delaying the input clock $CK_{IN}$.

The first unit delay line 12 generates the first internal clock $CK_{Q1}$ by delaying the input clock $CK_{IN}$, the second unit delay line 14 generates the second internal clock $CK_{IB1}$ by delaying the first internal clock $CK_{Q1}$, the third unit delay line 16 generates the third internal clock $CK_{QB1}$ by delaying the second internal clock $CK_{IB1}$, and the fourth unit delay line 18 generates the fourth internal clock $CK_{IT}$ by delaying the third internal clock $CK_{QB1}$.

Delay amounts of the first to fourth unit delay lines 12, 14, 16, and 18 may be adjusted according to first to fourth code signals CONT1, CONT2, CONT3, and CONT4, respectively.

For example, the first to fourth unit delay lines 12, 14, 16, and 18 receive the first to fourth code signals CONT1, CONT2, CONT3, and CONT4 from the digital circuit 40, respectively. The first to fourth code signals CONT1, CONT2, CONT3, and CONT4 are code values for adjusting the delay amounts of the first to fourth unit delay lines 12, 14, 16, and 18, respectively. The code values may be sequentially updated by the digital circuit 40.

Accordingly, the delay amounts of the first to fourth unit delay lines 12, 14, 16, and 18 may be sequentially controlled one by one at a time by the first to fourth code signals CONT1, CONT2, CONT3, and CONT4 that are updated one by one at a time.

Furthermore, the first to fourth unit delay lines 12, 14, 16, and 18 may have substantially the same minimum delay value. The minimum delay may be defined as the smallest delay value of a unit delay line.

Each of the first to fourth unit delay lines 12, 14, 16, and 18 may have an minimum delay value corresponding to ΔT. Therefore, a phase difference between two internal clocks that are sequentially generated among the first to fourth internal clocks $CK_{Q1}$, $CK_{IB1}$, $CK_{QB1}$, and $CK_{IT}$ may correspond to the minimum delay value ΔT.

The first to fourth sub-delay lines 22, 24, 26, and 28 generate first to fourth phase clocks $CK_I$, $CK_Q$, $CK_{IB}$, and $CK_{QB}$ by delaying the input clock $CK_{IN}$ and the first to third internal clocks $CK_{Q1}$, $CK_{IB1}$, and $CK_{QB1}$, respectively.

Specifically, the first sub-delay line 22 generates the first phase clock $CK_I$ by delaying the input clock $CK_{IN}$, the second sub-delay line 24 generates the second phase clock $CK_Q$ by delaying the first internal clock $CK_{Q1}$, the third sub-delay line 26 generates the third phase clock $CK_{IB}$ by delaying the second internal clock $CK_{IB1}$, and the fourth sub-delay line 28 generates the fourth phase clock $CK_{QB}$ by delaying the third internal clock $CK_{QB1}$. The fourth internal clock $CK_{IT}$ outputted from the fourth unit delay line 18 is used as a fifth phase clock $CK_{IT}$.

Delay values of the first to fourth sub-delay lines 22, 24, 26, and 28 may be used to adjust phase differences among the first to fourth phase clocks $CK_I$, $CK_Q$, $CK_{IB}$, and $CK_{QB}$, that is, to adjust a phase difference of the delay locked loop 100 due to a minimum delay.

For example, the delay locked loop 100 may adjust the delay values of the first to fourth sub-delay lines 22, 24, 26, and 28 so that the phase difference of the delay locked loop 100 due to the minimum delay is smaller than a value obtained by dividing one cycle of the input clock $CK_{IN}$ by the number of the first to fourth phase clocks $CK_I$, $CK_Q$, $CK_{IB}$, and $CK_{QB}$.

More specifically, the main delay circuit 10 includes the first to fourth unit delay lines 12, 14, 16, and 18 that are serially connected to one another, and each of the first to fourth unit delay lines 12, 14, 16, and 18 includes a coarse delay line (CDL) and a fine delay line (FDL).

For example, the coarse delay line (CDL) and the fine delay line (FDL) may be designed based on a NAND gate. The delay values of the first to fourth sub-delay lines 22, 24, 26, and 28 may be reduced by a predetermined value corresponding to N times a delay value of the coarse delay line (CDL) in the order of the phase clocks $CK_I$, $CK_Q$, $CK_{IB}$, and $CK_{QB}$, in which a phase difference of the first to fourth unit delay lines 12, 14, 16, and 18 becomes larger, on the basis of the input clock $CK_{IN}$.

For example, when a minimum delay value of the coarse delay line (CDL) is $T_D$, the delay value of the first sub-delay line 22 may be set to $4N*T_D$, the delay value of the second sub-delay line 24 may be set to $3N*T_D$, the delay value of the third sub-delay line 26 may be set to $2N*T_D$, and the delay value of the fourth sub-delay line 28 may be set to $N*T_D$, wherein N is an integer number. The minimum delay value $T_D$ of the coarse delay line (CDL) may be equal to or smaller than the minimum delay value ΔT of each of the first to fourth unit delay lines 12, 14, 16, and 18.

When the minimum delay value of each of the first to fourth unit delay lines 12, 14, 16, and 18 is defined as ΔT, the minimum delay value of the coarse delay line (CDL) is defined as $T_D$, and N is defined as 1, the phase difference due to the minimum delay values ΔT and $T_D$ among the first to fifth phase clocks $CK_I$, $CK_Q$, $CK_{IB}$, $CK_{QB}$, and $CK_{IT}$ may be calculated by the following Equation 1.

$$\begin{aligned} CK_I &\Rightarrow 4T_D \\ CK_Q &\Rightarrow \Delta T + 3T_D \\ CK_{IB} &\Rightarrow 2\Delta T + 2T_D \\ CK_{QB} &\Rightarrow 3\Delta T + T_D \\ CK_{IT} &\Rightarrow 4\Delta T \end{aligned} \quad \begin{matrix} \Delta T - T_D \\ \Delta T - T_D \\ \Delta T - T_D \\ \Delta T - T_D \end{matrix} \qquad \text{Equation 1}$$

As described above, a phase difference due to the minimum delay values ΔT and $T_D$ between the first phase clock $CK_I$ and the second phase clock $CK_Q$ may be defined as ΔT−$T_D$, and a phase difference between the second phase clock $CK_Q$ and the third phase clock $CK_{IB}$ may be defined as ΔT−$T_D$, a phase difference between the third phase clock $CK_{IB}$ and the fourth phase clock $CK_{QB}$ may be defined as ΔT−$T_D$, and a phase difference between the fourth phase clock $CK_{QB}$ and the fifth phase clock $CK_{IT}$ may be defined as ΔT−$T_D$.

That is, since the delay locked loop 100 in accordance with the embodiment may set a minimum delay value of a combined unit delay line to ΔT−N*$T_D$, this minimum delay value may be reduced as the value of N is increased and may be set to 0 to a negative value by adjusting the minimum delay values ΔT and $T_D$ and N. Herein, the combined unit delay line represents a combination of a unit delay line and a sub-delay line. The phase difference of the delay locked loop 100 due to the minimum delay corresponds to the minimum delay value of the combined unit delay line, i.e., ΔT−N*$T_D$.

Accordingly, the delay locked loop 100 in accordance with the embodiment may be designed without limitation of a frequency range, and may be applied to design of a semiconductor device that requires an operation at a high frequency.

The delay locked loop 100 further includes a phase detector 30 and the digital circuit 40.

The phase detector 30 and the digital circuit 40 may be used to generate the first to fourth code signals CONT1, CONT2, CONT3, and CONT4 for adjusting the delay amounts of the first to fourth unit delay lines 12, 14, 16, and 18, respectively.

The phase detector 30 compares phases of the first phase clock $CK_I$ and the fifth phase clock $CK_{IT}$ with each other, and provides the digital circuit 40 with a phase detection signal UP/DN according to a result of the comparison. In an embodiment, when a phase difference between the first phase clock $CK_I$ and the fifth phase clock $CK_{IT}$ is equal to greater than a predetermined value, e.g., 90°, the phase detector 30 provides the digital circuit 40 with a down signal DN. On the other hand, when the phase difference between the first phase clock $CK_I$ and the fifth phase clock $CK_{IT}$ is smaller than the predetermined value, the phase detector 30 provides the digital circuit 40 with an up signal UP.

The digital circuit 40 stores information regarding a code signal that is to be updated among the first to fourth code signals CONT1, CONT2, CONT3, and CONT4 corresponding to the first to fourth unit delay lines 12, 14, 16, and 18, and updates the first to fourth code signals CONT1, CONT2, CONT3, and CONT4 one by one according to the phase detection signal UP/DN.

Figure 2:
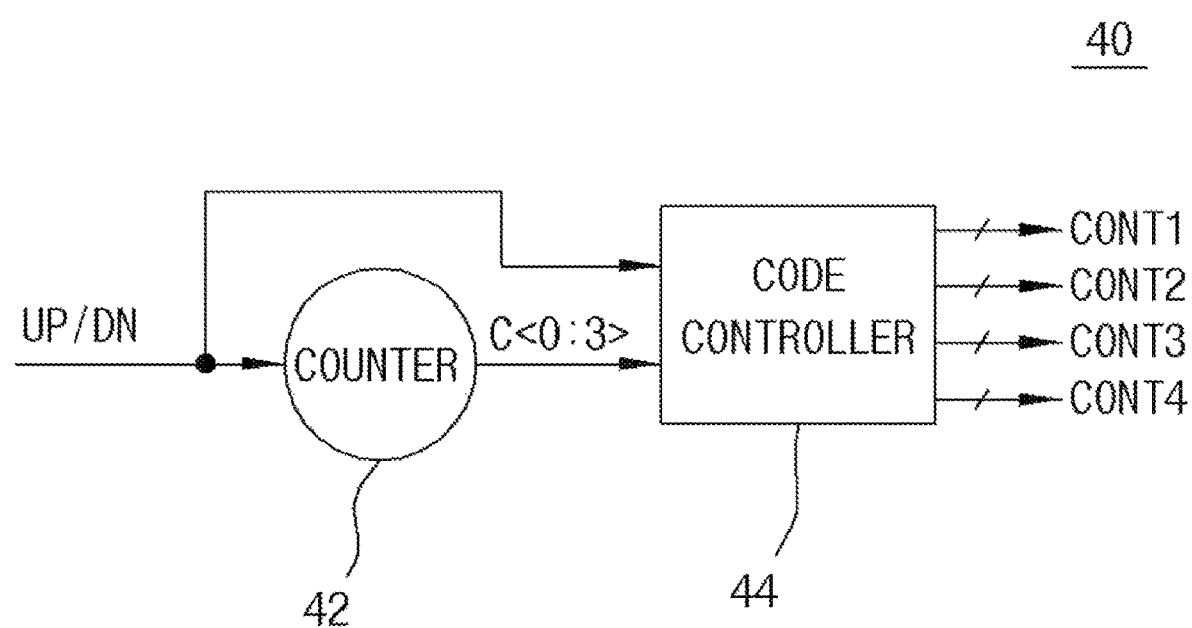
FIG. 2 illustrates a digital circuit shown in FIG. 1 in accordance with an embodiment.

FIG. 2 illustrates the digital circuit 40 shown in FIG. 1 in accordance with an embodiment. Referring to FIG. 2, the digital circuit 40 may include a counter 42 and a code controller 44.

The counter 42 stores a count value C<0:3>, changes the count value C<0:3> whenever the phase detection signal UP/DN is received, and outputs the changed count value C<0:3> to the code controller 44. The count value C<0:3> indicates information regarding a code signal that is to be updated among the first to fourth code signals CONT1, CONT2, CONT3, and CONT4 corresponding to the first to fourth unit delay lines 12, 14, 16, and 18.

That is, the counter 42 may be used to store information on a unit delay line that is to be updated among the first to fourth unit delay lines 12, 14, 16, and 18.

For example, the counter 42 may set an initial count value C<0:3> to 00, and change the count value C<0:3> in the order of 01, 10, and 11 from 00 or in the order of 11, 10, and 01 from 00 whenever the phase detection signal UP/DN is received. The counter 42 may be composed of a bi-directional counter that increases or decreases the count value C<0:3> according to the phase detection signal UP/DN.

The code controller 44 updates a code signal input to a unit delay line based on the count value C<0:3>.

For example, the code controller 44 updates the first code signal CONT1 for the first unit delay line 12 when the count value C<0:3> is 00, updates the second code signal CONT2 for the second unit delay line 14 when the count value C<0:3> is 01, updates the third code signal CONT3 for the third unit delay line 16 when the count value C<0:3> is 10, and updates the fourth code signal CONT4 for the fourth unit delay line 18 when the count value C<0:3> is 11.

As described above, the code controller 44 updates code signals for unit delay lines one by one based on whenever the phase detection signal UP/DN is received.

Accordingly, the delay locked loop 100 in accordance with the embodiment updates the first to fourth code signals CONT1, CONT2, CONT3, and CONT4 for adjusting the delay amounts of the first to fourth unit delay lines 12, 14, 16, and 18 one by one at a time, so that the total time resolution has substantially the same value as the time resolution of the unit delay line. For example, the delay locked loop 100 updates the first code signal CONT1 for the first unit delay line 12 when the count value C<0:3> is 00, updates the second code signal CONT2 for the second unit delay line 14 when the count value C<0:3> is 01, updates the third code signal CONT3 for the third unit delay line 16 when the count value C<0:3> is 10, and updates the fourth code signal CONT4 for the fourth unit delay line 18 when the count value C<0:3> is 11. Herein, updating represents increasing or decreasing values of the first to fourth code signals CONT1, CONT2, CONT3, and CONT4 according to the phase detection signal UP/DN. The first to fourth unit delay lines 12, 14, 16, and 18 may be designed based on a plurality of NAND gates. As such, the plurality of NAND gates may be selectively activated according to a code signal. The delay amounts of the first to fourth unit delay lines 12, 14, 16, and 18 may be individually adjusted according to the number of the NAND gates selectively activated according to the first to fourth code signals CONT1, CONT2, CONT3, and CONT4.

As described above, the delay locked loop 100 may individually adjust the delay amounts of the first to fourth unit delay lines 12, 14, 16, and 18 according to the first to fourth code signals CONT1, CONT2, CONT3, and CONT4, thereby reducing the time resolution.

Meanwhile, the delay locked loop 100 may include a clock buffer (not illustrated) that buffers an external clock and provide the buffered external clock, i.e., the input clock $CK_{IN}$, to the main delay circuit 10.

Furthermore, the digital circuit 40 may further include a shift register (not illustrated) that stores the first to fourth code signals CONT1, CONT2, CONT3, and CONT4 and provides the first to fourth code signals CONT1, CONT2, CONT3, and CONT4 to the first to fourth unit delay lines 12, 14, 16, and 18 of the main delay circuit 10.

The delay locked loop 100 performs a locking operation by comparing the phases of the first phase clock $CK_I$ and the fifth phase clock $CK_{IT}$ with each other and adjusting the delay amounts of the first to fourth unit delay lines 12, 14, 16, and 18 according to the phase detection signal UP/DN based on the result of the comparison. For example, the delay locked loop 100 may adjust the delay amounts of the first to fourth unit delay lines 12, 14, 16, and 18 to align the phases of the first phase clock $CK_I$ and the fifth phase clock $CK_{IT}$ to the same phase. And, the delay locked loop 100 locks phases of the first to fifth phase clocks $CK_I$, $CK_Q$, $CK_{IB}$, $CK_{QB}$, and $CK_{IT}$ when the phases of the first phase clock $CK_I$ and the fifth phase clock $CK_{IT}$ are aligned in the same phase. Herein, the locking operation indicates stopping the adjustment of the delay amounts of the first to fourth unit delay lines 12, 14, 16, and 18 to lock the phase of the first to fifth phase clocks $CK_I$, $CK_Q$, $CK_{IB}$, $CK_{QB}$, and $CK_{IT}$.

The first to fourth unit delay lines 12, 14, 16, and 18 may include the coarse delay line (CDL) and the fine delay line (FDL), and delay values of the coarse delay line (CDL) and the fine delay line (FDL) may be adjusted.

Figure 3:
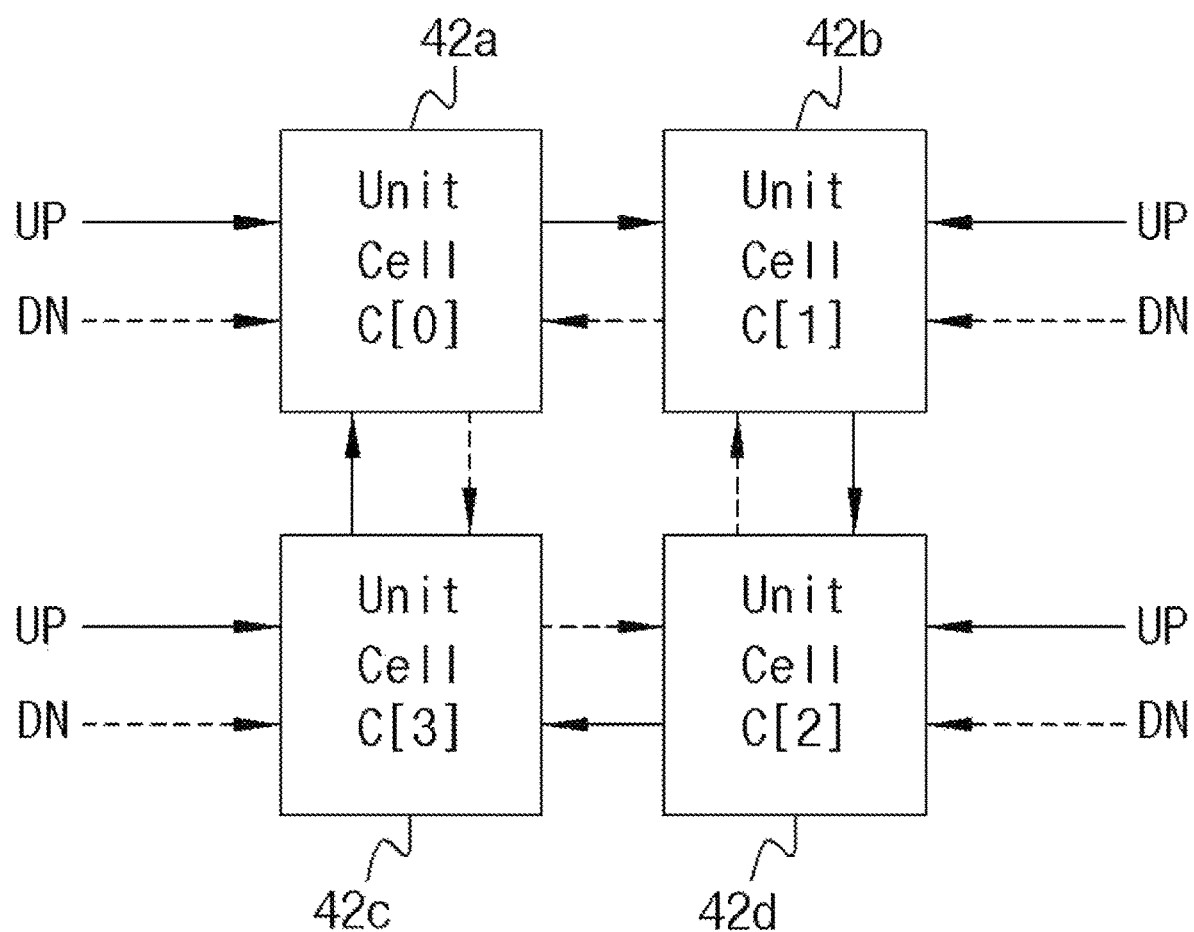
FIG. 3 illustrates a counter shown in FIG. 2 in accordance with an embodiment.

FIG. 3 illustrates the counter 42 shown in FIG. 2 in accordance with an embodiment.

Referring to FIG. 3, the counter 42 may use a 2-bit counter when the delay locked loop 100 generates the four phase clocks, and may include first to fourth unit cells 42a to 42d.

The counter 42 changes the count value C<0:3> in a clockwise or counter-clockwise direction on the basis of the input of the phase detection signal UP/DN.

When the up signal UP is inputted as the phase detection signal UP/DN, the counter 42 changes values of the first to fourth unit cells 42a to 42d in the clockwise direction, and when the down signal DN is inputted as the phase detection signal UP/DN, the counter 42 changes the values of the first to fourth unit cells 42a to 42d in the counter-clockwise direction.

For example, the initial count value C<0:3> may be set to 00, may be changed in the order of 01, 10, and 11 from 00 when the up signal UP is received, and may be changed in the order of 11, 10, and 01 from 00 when the down signal DN is received.

With such a change in the count value C<0:3>, the first to fourth code signals CONT1, CONT2, CONT3, and CONT4 are sequentially updated one by one whenever the digital circuit 40 receives the phase detection signal UP/DN. One of the unit delay lines 12, 14, 16, and 18 shown in FIG. 1 adjusts its delay amount, e.g., $T_D$, in response to the updated one of the first to fourth code signals CONT1, CONT2, CONT3, and CONT4.

Figure 4:
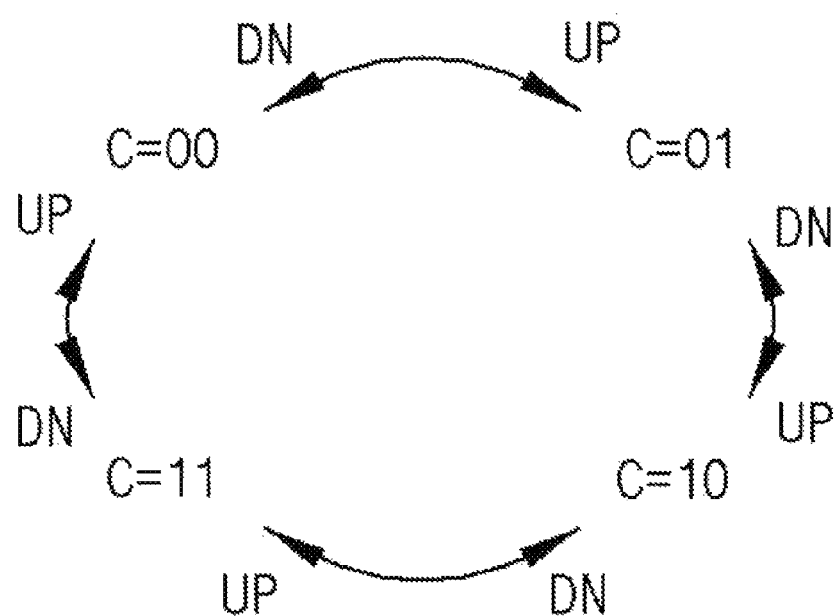
FIG. 4 illustrates an operation of the counter shown in FIG. 2.

FIG. 4 illustrates an operation of the counter 42 shown in FIG. 2.

Referring to FIG. 4, whenever the up signal UP is inputted, the counter 42 changes the count value C<0:3> in the order of 00, 01, 10, and 11, and whenever the down signal DN is inputted, the counter 42 changes the count value C<0:3> in the order of 00, 11, 10, and 01. For example, when the count value C<0:3> is changed in the order of 00, 01, 10, and 11, the delay amounts of the unit delay lines 12, 14, 16, and 18 may be increased, and, on the other hand, when the count value C<0:3> is changed in the order of 00, 11, 10, and 01, the delay amounts of the unit delay lines 12, 14, 16, and 18 may be decreased.

As described above, the counter 42 changes the count value C<0:3> in the clockwise or counter-clockwise direction according to the phase detection signal UP/DN.

In this way, the counter 42 provides information indicating which unit delay line is to be updated among the first to fourth unit delay lines 12, 14, 16, and 18 by changing the count value C<0:3> according to the phase detection signal UP/DN. For example, when the count value C<0:3> is 00, the first code signal CONT1 for the first unit delay line 12 is updated, and when the count value C<0:3> is 01, the second code signal CONT2 for the second unit delay line 14 is updated. When the count value C<0:3> is 10, the third code signal CONT3 for the third unit delay line 16 is updated, and when the count value C<0:3> is 11, the fourth code signal CONT4 for the fourth unit delay line 18 is updated. Therefore, one of the first to fourth unit delay lines 12, 14, 16, and 18 is updated to adjust its delay amount at a time in response to a corresponding updated code signal among the first to fourth code signals CONT1, CONT2, CONT3, and CONT4.

Meanwhile, the counter 42 may change the count value C<0:3> such that the first to fourth code signals CONT1, CONT2, CONT3, and CONT4 are sequentially updated in the order of serial connection of the first to fourth unit delay lines 12, 14, 16, and 18 by or in the reverse order thereof according to the phase detection signal UP/DN.

As described above, the delay locked loop 100 in accordance with the embodiment can solve the problems of the minimum delay and the time resolution.

In relation to the minimum delay, the delay locked loop 100 can adjust the initial phase difference among the first to fourth phase clocks $CK_I$, $CK_Q$, $CK_{IB}$, and $CK_{QB}$ by using the delay values of the first to fourth sub-delay lines 22, 24, 26, and 28. That is, the delay locked loop 100 can adjust the phase difference of the delay locked loop 100 due to the minimum delay using the first to fourth sub-delay lines 22, 24, 26, and 28.

Such a delay locked loop 100 can generate the phase clocks $CK_I$, $CK_Q$, $CK_{IB}$, and $CK_{QB}$ that guarantee an operation at a desired frequency by solving the problem of the minimum delay, so that it is possible to design a high speed semiconductor device without frequency limitation.

In relation to the time resolution, in the delay locked loop 100, since the first to fourth unit delay lines 12, 14, 16, and 18 are controlled to adjust delay amounts in response to code signals changing one by one at a time, the total time resolution can be maintained at a level of the time resolution of a unit delay line.

Such a delay locked loop 100 can improve the quality of multi-phase clocks by solving the problem of the time resolution, thereby improving the performance of a semiconductor device and operating the semiconductor device at a high speed.

Although various embodiments have been described for illustrative purposes, it will be apparent to those skilled in the art that various changes and modifications may be made without departing from the spirit and scope of the invention as defined in the following claims.

What is claimed is:

1. A delay locked loop comprising:
a main delay circuit including a plurality of unit delay lines that generate a plurality of internal clocks by delaying an input clock, delay amounts of the plurality of unit delay lines being adjusted in response to code signals;
a sub-delay circuit including a plurality of sub-delay lines that generate a plurality of phase clocks by respectively delaying the input clock and the plurality of internal clocks;
a phase detector configured to compare phases of the plurality of phase clocks and provide a phase detection signal according to a result of the comparison; and
a digital circuit configured to update the code signals corresponding to the plurality of unit delay lines one by one at a time when the phase detection signal is provided to the digital circuit,
wherein the digital circuit comprises:

a counter configured to store a count value and change the count value when the phase detection signal is received; and a code controller configured to receive the count value and update a code signal corresponding to the count value among the code signals.

2. The delay locked loop of claim 1, wherein the digital circuit stores information regarding a code signal of a unit delay line to be updated when the phase detection signal is received, and updates the code signal corresponding to the information.

3. The delay locked loop of claim 1, wherein the counter sets the count value as a preset initial value, and changes the count value when the phase detection signal is received.

4. The delay locked loop of claim 3, wherein the counter increases or decreases the count value according to the phase detection signal.

5. The delay locked loop of claim 1, wherein the code controller updates the code signal corresponding to the count value whenever the phase detection signal is received.

6. The delay locked loop of claim 1, wherein the delay amounts of the plurality of unit delay lines are adjusted one by one by the code signals.

7. The delay locked loop of claim 1, wherein delay values of the plurality of sub-delay lines are used to adjust the phase difference.

8. The delay locked loop of claim 7, wherein the plurality of sub-delay lines have delay values that are reduced by a predetermined value in a sequential order of the plurality of phase clocks, the predetermined value corresponding to N times a minimum delay value of a unit delay line.

9. A delay locked loop comprising:
a main delay circuit including first to fourth unit delay lines that generate first to fourth internal clocks by delaying an input clock, delay amounts of the first to fourth unit delay lines being adjusted one by one in response to first to fourth code signals;
a sub-delay circuit configured to generate first to fourth phase clocks by respectively delaying the input clock and the first to third internal clocks with first to fourth delay values;
a phase detector configured to compare phases of the first and fourth phase clocks and provide a phase detection signal according to a result of the comparison; and
a digital circuit configured to update the first to fourth code signals one by one at a time when the phase detection signal is provided to the digital circuit,
wherein the digital circuit comprises:
a counter configured to store a count value and change the count value when the phase detection signal is received; and
a code controller configured to receive the count value and update one of the first to fourth code signals that corresponds to the count value.

10. The delay locked loop of claim 9, wherein the counter sets the count value as a preset initial value, and increases or decreases the count value when the phase detection signal is received.

11. The delay locked loop of claim 9, wherein the code controller updates one of the first to fourth code signals whenever the phase detection signal is received.

12. The delay locked loop of claim 9, wherein the first to fourth delay values of the sub-delay circuit are used to adjust the phase difference.

13. The delay locked loop of claim 9, wherein the sub-delay circuit comprises:
a first sub-delay line configured to generate the first phase clock by delaying the input clock with the first delay value;
a second sub-delay line configured to generate the second phase clock by delaying the first internal clock with the second delay value;
a third sub-delay line configured to generate the third phase clock by delaying the second internal clock with the third delay value; and
a fourth sub-delay line configured to generate the fourth phase clock by delaying the third internal clock with the fourth delay value.

14. The delay locked loop of claim 13, wherein the first to fourth delay values are sequentially reduced by a predetermined value, the predetermined value corresponding to N times a minimum delay value of a unit delay line.

15. A method of generating phase clocks of a delay locked loop, the method comprising:
generating, using a plurality of unit delay lines, a plurality of internal clocks by delaying an input clock;
generating, using a plurality of sub-delay lines, a plurality of phase clocks by respectively delaying the input clock and the plurality of internal clocks, two phase clocks, which are sequentially generated among the plurality of phase clocks, having a phase difference corresponding to a desired minimum delay value;
comparing, using a phase detector, phases of the plurality of phase clocks to thereby provide a phase detection signal according to a result of the comparison; and
updating, using a digital circuit, code signals corresponding to the plurality of unit delay lines one by one at a time when the phase detection signal is provided, an updated code signal being used to adjust a delay amount of a corresponding one of the plurality of unit delay lines,
wherein the updating comprises:
changing a count value when the phase detection signal is received; and
updating a code signal corresponding to the changed count value among the code signals.

16. The method of claim 15, wherein the plurality of sub-delay lines have delay values that are reduced by a predetermined value in a sequential order of the plurality of phase clocks, the predetermined value corresponding to N times a minimum delay value of a unit delay line.

17. The method of claim 16, wherein the count value is set to a preset initial value, and increased or decreased whenever the phase detection signal is received.

* * * * *